United States Patent
Burgess et al.

(10) Patent No.: US 8,728,953 B2
(45) Date of Patent: May 20, 2014

(54) METHOD AND APPARATUS FOR PROCESSING A SEMICONDUCTOR WORKPIECE

(71) Applicant: SPTS Technologies Limited, Newport (GB)

(72) Inventors: Stephen R Burgess, Gwent (GB); Anthony P Wilby, Bristol (GB)

(73) Assignee: SPTS Technologies Limited, Newport (GB)

(*) Notice: Subject to any disclaimer, the term of this patent is extended or adjusted under 35 U.S.C. 154(b) by 0 days.

(21) Appl. No.: 13/965,254

(22) Filed: Aug. 13, 2013

(65) Prior Publication Data

US 2014/0045340 A1    Feb. 13, 2014

Related U.S. Application Data

(60) Provisional application No. 61/682,379, filed on Aug. 13, 2012, provisional application No. 61/779,162, filed on Mar. 13, 2013.

(51) Int. Cl.
*H01L 21/31* (2006.01)

(52) U.S. Cl.
USPC .......................... 438/758; 438/761; 438/778

(58) Field of Classification Search
USPC .......... 438/758, 761, 763, 778, 780, 781, 782
See application file for complete search history.

(56) References Cited

U.S. PATENT DOCUMENTS

| 7,952,049 B2 * | 5/2011 | Tsukamoto ............ 219/121.58 |
| 2005/0042876 A1 * | 2/2005 | Kobayashi et al. ........... 438/690 |
| 2010/0247804 A1 | 9/2010 | Roy |
| 2013/0052834 A1 * | 2/2013 | Kielwein et al. .............. 438/758 |

FOREIGN PATENT DOCUMENTS

DE          3633386 A1    4/1998

* cited by examiner

*Primary Examiner* — Kevin M Picardat
(74) *Attorney, Agent, or Firm* — Volentine & Whitt, PLLC

(57) ABSTRACT

A method of processing a semiconductor workpiece includes placing a back surface of the workpiece on a workpiece support in a chamber so that the front surface of the workpiece faces into the chamber for processing, and the back surface is in fluid communication with a back region having an associated back gas pressure. The method further includes performing a workpiece processing step at a first chamber pressure $P_{c1}$ and a first back pressure $P_{b1}$, wherein $P_{c1}$ and $P_{b1}$ give rise to a pressure differential, $P_{b1}-P_{c1}$, and performing a workpiece cooling step at a second chamber pressure $P_{c2}$ and a second back pressure $P_{b2}$, wherein $P_{c2}$ and $P_{b2}$ are higher than $P_{c1}$ and $P_{b1}$, respectively.

19 Claims, 2 Drawing Sheets

METHOD AND APPARATUS FOR PROCESSING A SEMICONDUCTOR WORKPIECE

BACKGROUND

This invention relates to a method and apparatus for processing a semiconductor workpiece.

Sputter deposition of metal films is widely used in the semiconductor and related industries. It is usually desirable to maximize the deposition rate of the sputtered film so that the number of wafers per hour that can be processed is as high as possible.

However, high deposition rate PVD (physical vapour deposition) processes present IC (integrated circuit) manufacturers with integration issues. As the power supplied to the sputter target increases so does the ability of the hot plasma and incoming energetic species to heat the wafer. For many applications it is necessary to keep the wafer temperature as low as possible to avoid affecting previously deposited materials that may be sensitive to elevated temperatures (e.g. polymers, adhesives, dielectrics, etc.).

One existing solution involves the processing of the wafer on a cold electrostatic chuck (ESC). At process pressure the thermal transfer between the wafer and the ESC is very low, (M. Klick, M. Bernt, JVAC 24 (2006)). The industry standard approach to improve thermal conductivity between the substrate and the chuck is to use a backside gas pressure. However, for thinned, highly warped, damaged, taped, or insulative wafers it can be very problematic to generate a clamping force that is sufficient to keep the wafer clamped during the deposition process when a gas back pressure is used. This type of problematic wafer is commonly encountered in the IC packaging industry. For example, it is common to utilise thinned wafers of thickness less than 100 microns, typically of 30-50 microns thickness. Wafers of this type are fragile, and can warp easily. A particular problem is encountered when a relatively thick layer of metal is deposited on the wafer. The metal layer is often 2-10 microns thick, which places an additional stress on a fragile wafer.

SUMMARY

The present invention, in at least some of its embodiments, provides a method for processing thinned, warped, insulative or otherwise problematic wafers at high deposition rate while maintaining a low process pressure. However, the invention is not limited to thinned, warped, insulative or other problematic wafers, and nor is it limited to the use of ESC devices to support and/or clamp the wafer.

According to a first aspect of the invention there is provided a method of processing a semiconductor workpiece having a front surface and a back surface, including the steps of:

i) placing the back surface of the workpiece on a workpiece support in a chamber so that the front surface of the workpiece faces into the chamber for processing, the chamber having an associated chamber gas pressure, and the back surface is in fluid communication with a back region having an associated back gas pressure;

ii) performing a workpiece processing step at a first chamber pressure $P_{c1}$ and a first back pressure $P_{b1}$, wherein $P_{c1}$ and $P_{b1}$ give rise to a pressure differential, $P_{b1}-P_{c1}$, which is maintained so as to avoid a pressure induced loss of contact between the workpiece and the workpiece support, and iii) performing a workpiece cooling step at a second chamber pressure $P_{c2}$ and a second back pressure $P_{b2}$, wherein $P_{c2}$ and $P_{b2}$ are higher than $P_{c1}$ and $P_{b1}$, respectively, at least $P_{b2}$ being sufficiently high to enhance cooling of the workpiece, and wherein $P_{c2}$ and $P_{b2}$ give rise to a pressure differential, $P_{b2}-P_{c2}$, which is maintained so as to avoid a pressure-induced loss of contact between the workpiece and the workpiece support.

In step iii), $P_{c2}$ may also be sufficiently high to enhance cooling of the workpiece.

According to a second aspect of the invention there is provided a method of processing a semiconductor workpiece having a front surface and a back surface, including the steps of:

i) placing the back surface of the workpiece on a workpiece support in a chamber so that the front surface of the workpiece faces into the chamber for processing, the chamber having an associated chamber gas pressure, and the back surface is in fluid communication with a back region having an associated back gas pressure;

ii) performing a workpiece processing step at a first chamber pressure $P_{c1}$ and a first back pressure $P_{b1}$, wherein $P_{c1}$ and $P_{b1}$ give rise to a pressure differential, $P_{b1}-P_{c1}$, which is maintained at less than +2 Torr.

iii) performing a workpiece cooling step at a second chamber pressure $P_{c2}$ and a second back pressure $P_{b2}$, wherein $P_{c2}$ and $P_{b2}$ are higher than $P_{c1}$ and $P_{b1}$, respectively, $P_{b2}$ is greater than or equal to 0.5 Torr, and wherein $P_{c2}$ and $P_{b2}$ give rise to a pressure differential, $P_{b2}-P_{c2}$, which is maintained at less than +2 Torr.

The steps ii) and iii) may form a processing/cooling cycle which is performed repeatedly.

The pressure differentials $P_{b1}-P_{c1}$ and $P_{b2}-P_{c2}$ may each be maintained at less than +1 Torr.

The pressure differentials $P_{b1}-P_{c1}$ and $P_{b2}-P_{c2}$ may each be maintained in the range −0.5 to +0.5 Torr.

During step iii) the pressure differential $P_{b2}-P_{c2}$ may be maintained at about 0 Torr. In some embodiments the chamber is in fluid communication with the back region during at least step iii) so that $P_{b2}$ is substantially equal to $P_{c2}$.

During step ii) the pressure differential $P_{b1}-P_{c1}$ may be maintained at about 0 Torr. The chamber may be in fluid communication with the back region during step ii) so that $P_{b1}$ is substantially equal to $P_{c1}$.

In some embodiments $P_{c2}$ is in the range 0.5 to 20 Torr, preferably about 1 Torr.

The workpiece may be clamped in place by the workpiece support.

In some embodiments, the workpiece support includes an electrostatic chuck. Typically, the workpiece is clamped by the electrostatic chuck. This can result in improved cooling and higher throughput. However, in other embodiments the workpiece is not clamped by the electrostatic chuck. It is possible to use other kinds of workpiece supports and clamping, such as mechanical clamps.

In some embodiments, the processing step may be a PVD (physical vapour deposition) process. In other embodiments, the processing step is a non-PVD process, such as a chemical vapour deposition process (CVD), for example a plasma enhanced chemical vapour deposition process (PECVD), ion implantation or reactive ion etching.

The processing step may be a metal sputtering process, such as an aluminium sputtering process. The metal layer produced by the processing step can place a stress on the workpiece, particularly with thinned wafers. The relatively small pressure differentials associated with the present invention are particularly advantageous in preventing the workpiece from being subjected to further undesirable stress.

The semiconductor workpiece may consist of at least one semiconductor material. Alternatively, the semiconductor workpiece may include at least one semiconductor material together with one or more non-semiconductor materials, such as insulators and metals. As noted above, a non-semiconductor material such as a metal can place a stress on the workpiece.

Typically, the semiconductor workpiece is a semiconductor wafer. The semiconductor wafer may be a thinned, warped, damaged, taped or insulative wafer, although the invention is not limited in this respect.

The semiconductor workpiece may be processed to produce an integrated circuit (IC).

According to a third aspect of the invention there is provided a semiconductor processing apparatus including: a chamber; a workpiece support positioned in the chamber; a gas supply and pumping arrangement for providing a desired chamber gas pressure in the chamber and a desired back gas pressure in a back region which, in use, is in fluid communication with a rear surface of a semiconductor workpiece; and a control arrangement configured to control the semiconductor processing apparatus, including the gas supply and pumping arrangement, to perform a method according to the first or second aspects of the invention.

Whilst the invention has been described above, it extends to any inventive combination of the features set out above, or in the following description, drawings or claims. For example, any feature described in relation to the first or second aspects of the invention may be incorporated in the third aspect of the invention and vice versa.

BRIEF DESCRIPTION OF THE DRAWINGS

The invention may be performed in various ways and specific embodiments will now be described, by way of example only, with reference to the accompanying drawings.

DETAILED DESCRIPTION OF EMBODIMENTS

Removing heat from a wafer during the deposition cycle in a PVD tool is a common problem. Ideally the temperature of the wafer is maintained at predetermined set point(s) during the PVD deposition cycle.

Figure 1:
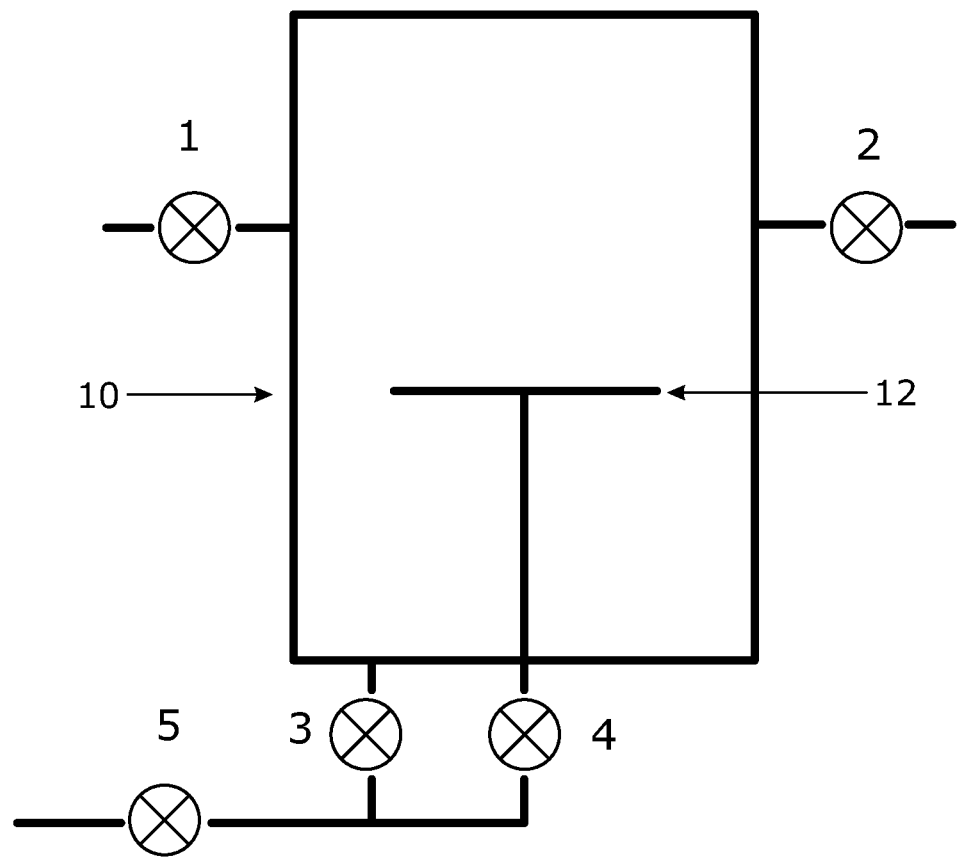
FIG. 1 is a semi-schematic diagram of an apparatus which can be used in conjunction with the invention.

The conventional way to remove heat from the wafer is to retain the wafer on the platen top by use of either a mechanical clamp or electrostatic chuck and pressurize a cavity on the backside of the wafer to ~1-15 Torr with an inert gas such as He. The relatively high pressure He aids heat transfer from the wafer to the platen. FIG. 1 below shows a simplified cross-section of a PVD deposition chamber 10 of known type having an electrostatic chuck (ESC) 12. The apparatus further comprises a process gas inlet having a process inlet gas valve 1, a process gas outlet having a highvac valve 2 and a pump (not shown), and a back pressure inlet to the electrostatic chuck 12 which includes a back pressure supply valve 5 and a back pressure control valve 4 which controls back pressure to the process wafer. The apparatus further comprises an electrostatic chuck back pressure pump valve 3 which enables back pressure gas to be evacuated when valves 2 and 3 are open and valve 1 is closed.

During normal clamped processing the valve configuration would be as shown in Table 1. The cavity behind the wafer is maintained at ~10 Torr (back pressure) while the PVD process is carried out at ~2 mTorr. This configuration will allow a good thermal transfer between the wafer and the ESC but there is a significant pressure differential ($5 \times 10^3$) which increases the tendency of certain wafer types to de-clamp. There are however a growing number of applications, such as thinned wafers and wafers on carriers, where the risk of electrostatic de-clamping makes this process not viable in a production environment. While mechanical clamps could be used they have significant problems related to particulate generation and as a result alternative approaches are typically preferred.

TABLE 1

| | | | | | | Chamber Pressure | Back Pressure | |
|---|---|---|---|---|---|---|---|---|
| Step | Valve 1 | Valve 2 | Valve 3 | Valve 4 | Valve 5 | Pc1 | Pb1 | ESC |
| Deposition | OPEN | OPEN | CLOSED | OPEN | OPEN | 2 mTorr | 10 Torr | ON |

Prior art ESC Process with Back Pressure

For wafer types which risk de-clamping an alternative approach is to carry out a dedicated cool down step following (part of the) deposition process. In Table 2 we can see a chamber "backfill" process where the wafer temperature is allowed to rise to an acceptable value during the deposition step when the sputtering process is stopped followed by a "backfill" cool process step where the chamber pressure is raise to ~1 Torr. Heat is lost to the platen assembly and the chamber walls. The chamber pressure Pc2 of 1 Torr is achieved by leaving valve 1 open after the deposition process is stopped until this backfill pressure is achieved. Then all the valves are operated as described in Table 2.

TABLE 2

Prior art Backfill Process

| Step | Valve 1 | Valve 2 | Valve 3 | Valve 4 | Valve 5 | Chamber Pressure Pc1/Pc2 | Back Pressure Pb1/Pb2 | ESC |
|---|---|---|---|---|---|---|---|---|
| Deposition | OPEN | OPEN | CLOSED | CLOSED | CLOSED | 2 mTorr | None | OFF |
| Backfill | CLOSED | CLOSED | CLOSED | CLOSED | CLOSED | 1 Torr | None | OFF |

This approach allows the wafer to be successfully processed but has significant productivity disadvantages. Thermal transfer to the platen is lost due to the absence of the ESC clamping force and the back pressure. Also, the deposition step must be kept short and the cool step long in order to maintain a low wafer temperature. This severely impacts the throughput of the process.

A novel method of processing is thus proposed to safely process wafers that cannot employ the standard ESC approach of Table 1 but offers greater productivity compared to the "Backfill" approach described in Table 2.

TABLE 3

ESC Deposition and Backfill

| Step | Valve 1 | Valve 2 | Valve 3 | Valve 4 | Valve 5 | Chamber Pressure Pc1/Pc2 | Back Pressure Pb1/Pb2 | ESC |
|---|---|---|---|---|---|---|---|---|
| Deposition | OPEN | OPEN | OPEN | OPEN | CLOSED | 2 mTorr | 2 mTorr | ON |
| Backfill | CLOSED | CLOSED | OPEN | OPEN | CLOSED | 1 Torr | 1 Torr | ON |

The process described in Table 3 uses an ESC to clamp the wafer during the deposition cycle. However, unlike a conventional ECS process (Table 1), Pb1-Pc1 is minimized by opening valve 4 while closing V5. A modified "Backfill" step is also used to maintain a small pressure differential between Pb2-Pc2 by opening valves 3 and 4. Using this technique it is possible to significantly lengthen the deposition step (dependent on wafer type) and shorten the cool step resulting in high throughput while avoiding the de-clamp issues associated with having a high pressure differential between the front and backside of the wafer.

Chambers of known type can be adapted to perform the invention by providing suitable control of the valves 1-5. This can be conveniently implemented by controlling the operation of the valves during processing with a suitably adapted control system (not shown) which may operate in accordance with suitable software.

Figure 2:
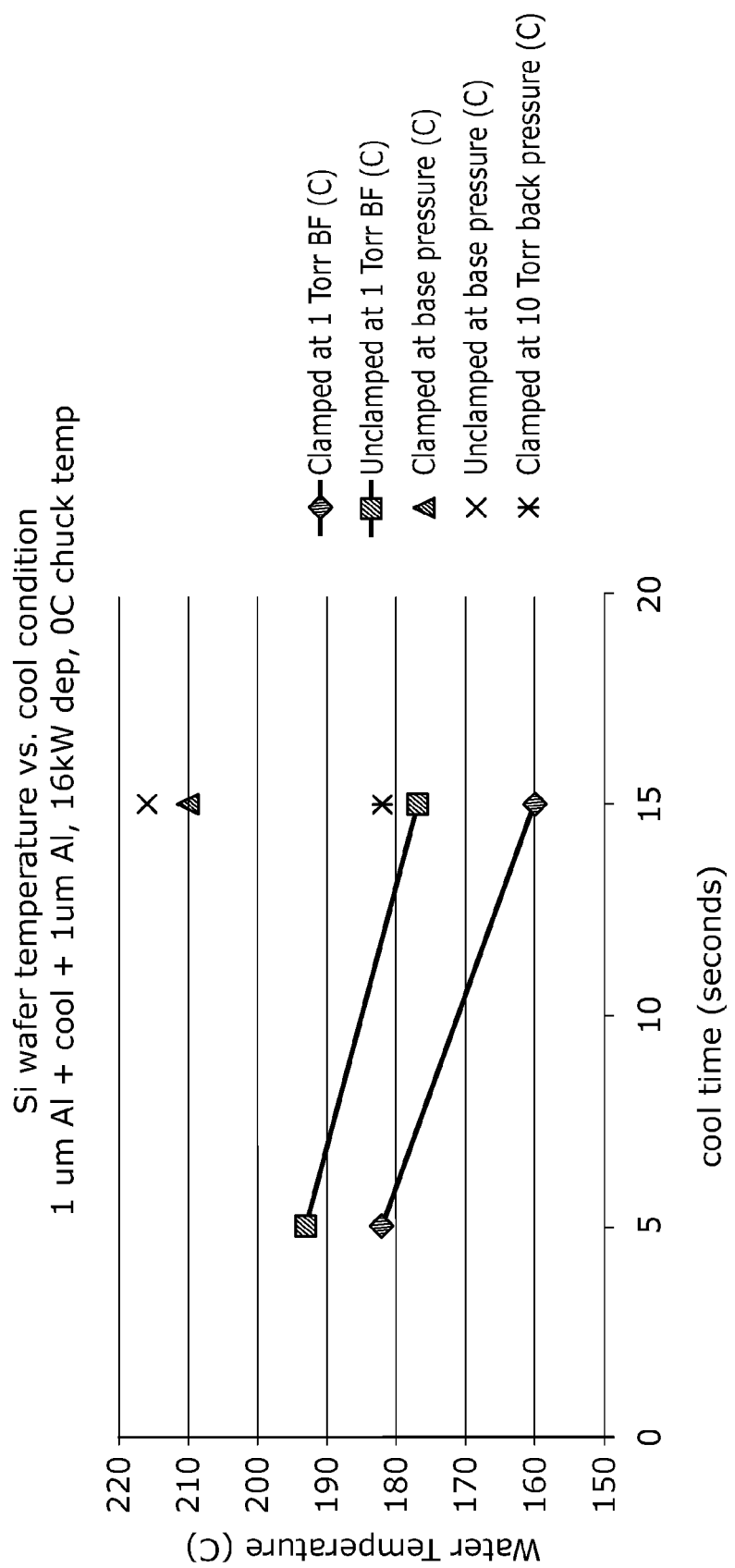
FIG. 2 shows wafer temperature (° C.) as a function of time for different cool down steps during an aluminium deposition process.

In FIG. 2 we can see the performance of various cool down steps as a function of time for a high power 16 kW, 2 micron Al deposition process. The cool down step is carried out after each deposition cycle. The platen/ESC is controlled at 0° C. while the wafers enter the chamber at 20° C.

It can be seen that a 15 sec 1 Torr cooldown step is significantly more efficient in reducing the temperature of the wafer than a 10 Torr backfill step, 160 vs 182° C., while clamping at base pressure also achieves a slight improvement over the unclamped process ~210-216° C.

Throughput comparisons for a high power 16 kW, 3 micron, Al process with a thermal budget of less than 200° C. than can be seen in Table 4. In both cases the Si wafers were bonded onto glass carrier wafers which had a polyimide protective tape on the glass face touching the platen assembly. The conventional backfill process requires multiple cooling steps to maintain the necessary film morphology and thermal budget control while the novel process only requires two relatively short backfill steps (where no deposition is taking place) and as such provides greater productivity.

TABLE 4

Throughput comparison between backfill and novel process (wph = wafers per hour).

| Process | Number of backfills | Throughput (wph) |
|---|---|---|
| Standard backfill process | 1 × 120 seconds<br>4 × 30 seconds<br>1 × 60 seconds | 4.9 |
| Novel process | 2 × 20 seconds | 9.1 |

The use of an equalized pressure at the front and back of the wafer in conjunction with ESC clamping enables the safe handling of warped wafers, provides better temperature control, and enables deposition to take place for a longer continuous period, in comparison to a prior art backfill process with no clamping. The use of pressurized backfills in combination with electrostatic clamping increases the efficiency of cooling and can result in higher throughput.

From an operational point of view, it is convenient to equalise the chamber pressure and the back pressure by opening valves 3 and 4 so that the chamber and the wafer backside region are in fluid communication. However, the skilled reader will appreciate that in alternative embodiments, the chamber and the wafer backside region may not be in fluid communication, but instead each form part of separate gas supply systems. The gas pressures of these separate gas supply systems can be set and maintained so that the pressures experienced by the front and back faces of the wafer are equal, or are set to achieve a desired pressure differential in accordance with the invention.

What is claimed is:

1. A method of processing a semiconductor workpiece having a front surface and a back surface, including the steps of:
   i) placing the back surface of the workpiece on a workpiece support in a chamber so that the front surface of the workpiece faces into the chamber for processing, the chamber having an associated chamber gas pressure, and the back surface is in fluid communication with a back region having an associated back gas pressure;
   ii) performing a workpiece processing step at a first chamber pressure $P_{c1}$ and a first back pressure $P_{b1}$, wherein $P_{c1}$ and $P_{b1}$ give rise to a pressure differential, $P_{b1}-P_{c1}$, which is maintained so as to avoid a pressure induced loss of contact between the workpiece and the workpiece support; and
   iii) performing a workpiece cooling step at a second chamber pressure $P_{c2}$ and a second back pressure $P_{b2}$, wherein $P_{c2}$ and $P_{b2}$ are higher than $P_{c1}$ and $P_{b1}$, respectively, at least $P_{b2}$ being sufficiently high to enhance cooling of the workpiece, and wherein $P_{c2}$ and $P_{b2}$ give rise to a pressure differential, $P_{b2}-P_{c2}$, which is maintained so as to avoid a pressure-induced loss of contact between the workpiece and the workpiece support.

2. A method accordingly to claim 1 in which, in step iii), $P_{c2}$ is sufficiently high to enhance cooling of the workpiece.

3. A method of processing a semiconductor workpiece having a front surface and a back surface, including the steps of:
   i) placing the back surface of the workpiece on a workpiece support in a chamber so that the front surface of the workpiece faces into the chamber for processing, the chamber having an associated chamber gas pressure, and the back surface is in fluid communication with a back region having an associated back gas pressure;
   ii) performing a workpiece processing step at a first chamber pressure $P_{c1}$ and a first back pressure $P_{b1}$, wherein $P_{c1}$ and $P_{b1}$ give rise to a pressure differential, $P_{b1}-P_{c1}$, which is maintained at less than +2 Torr;
   iii) performing a workpiece cooling step at a second chamber pressure $P_{c2}$ and a second back pressure $P_{b2}$, wherein $P_{c2}$ and $P_{b2}$ are higher than $P_{c1}$ and $P_{b1}$, respectively, $P_{b2}$ is greater than or equal to 0.5 Torr, and wherein $P_{c2}$ and $P_{b2}$ give rise to a pressure differential, $P_{b2}-P_{c2}$, which is maintained at less than +2 Torr.

4. A method according to claim 3 in which the pressure differentials $P_{b1}-P_{c1}$ and $P_{b2}-P_{c2}$ are each maintained at less than +1 Torr.

5. A method according to claim 3 in which the pressure differentials $P_{b1}-P_{c1}$ and $P_{b2}-P_{c2}$ are each maintained in the range −0.5 to +0.5 Torr.

6. A method according to claim 3 in which during step iii) the pressure differential $P_{b2}-P_{c2}$ is maintained at about 0 Torr.

7. A method according to claim 6 in which during step iii) the chamber is in fluid communication with the back region so that $P_{b2}$ is substantially equal to $P_{c2}$.

8. A method according to claim 3 in which during step ii) the pressure differential $P_{b1}-P_{c1}$ is maintained at about 0 Torr.

9. A method according to claim 8 in which during step ii) the chamber is in fluid communication with the back region so that $P_{b1}$ is substantially equal to $P_{c1}$.

10. A method according to claim 3 in which $P_{c2}$ is in the range 0.5 to 20 Torr, preferably about 1 Torr.

11. A method according to claim 3 in which the workpiece is clamped in place by the workpiece support.

12. A method according to claim 11 in which the workpiece support includes an electrostatic chuck.

13. A method according to claim 12 in which the workpiece is clamped by the electrostatic chuck.

14. A method according to claim 3 in which the processing step is a PVD (physical vapour deposition) process.

15. A method according to claim 3 in which the processing step is a metal sputtering process.

16. A method according to claim 3 in which the semiconductor workpiece is a semiconductor wafer.

17. A method according to claim 16 in which the semiconductor wafer is a thinned, warped, damaged, taped or insulative wafer.

18. A method according to claim 3 in which the semiconductor workpiece is processed to produce an integrated circuit.

19. A semiconductor processing apparatus including: a chamber; a workpiece support positioned in the chamber; a gas supply and pumping arrangement for providing a desired chamber gas pressure in the chamber and a desired back gas pressure in a back region which, in use, is in fluid communication with a rear surface of a semiconductor workpiece; and a control arrangement configured to control the semiconductor processing apparatus, including the gas supply and pumping arrangement, to perform a method according to claim 3.

* * * * *